(12) United States Patent
Ehrenberg

(10) Patent No.: US 11,515,131 B2
(45) Date of Patent: Nov. 29, 2022

(54) SYSTEM FOR FOCUSED DEPOSITION OF ATOMIC VAPORS

(71) Applicant: The Charles Stark Draper Laboratory Inc., Cambridge, MA (US)

(72) Inventor: Isaac Ehrenberg, Brookline, MA (US)

(73) Assignee: The Charles Stark Draper Laboratory Inc., Cambridge, MA (US)

( * ) Notice: Subject to any disclaimer, the term of this patent is extended or adjusted under 35 U.S.C. 154(b) by 0 days.

(21) Appl. No.: 16/706,029

(22) Filed: Dec. 6, 2019

(65) Prior Publication Data
US 2021/0175056 A1    Jun. 10, 2021

(51) Int. Cl.
   H01J 37/34    (2006.01)
   C23C 14/34    (2006.01)
   H01J 37/32    (2006.01)

(52) U.S. Cl.
   CPC .......... *H01J 37/3432* (2013.01); *C23C 14/34* (2013.01); *H01J 37/32431* (2013.01); *H01J 37/32449* (2013.01); *H01J 2237/332* (2013.01)

(58) Field of Classification Search
   None
   See application file for complete search history.

(56) References Cited

U.S. PATENT DOCUMENTS

| | | | | |
|---|---|---|---|---|
| 5,273,609 A * | 12/1993 | Moslehi | ................. | C23C 16/52 118/722 |
| 7,108,894 B2 | 9/2006 | Renn | | |
| 8,501,624 B2 * | 8/2013 | Koo | ................. | H01J 37/32422 438/689 |
| 2004/0188019 A1 * | 9/2004 | Lopes Cardozo | ....... | H05H 1/44 156/345.43 |
| 2015/0144595 A1 * | 5/2015 | Inai | ........................ | B08B 7/005 216/63 |
| 2016/0115585 A1 | 4/2016 | Burwell et al. | | |

OTHER PUBLICATIONS

"Atmospheric Pressure Plasma Based Fabrication of Printable Electronics and Functional Coatings," National Aeronautics and Space Administration, Accessed via Web Jul. 9, 2020 at https://technology-arc.ndc.nasa.gov/featurestory/printable-electronics, 2019 (1 p).
Burwell, "A Microplasma-Based Sputtering System for Direct-Write, Microscale Fabrication of Thin-Film Metal Structures," Dissertation submission to Case Western Reserve University, Dept of Elect Engineering and Computer Science, Jan. 2016.
Kornbluth et al., "Atmospheric Microplasma Sputter Deposition of Interconnects," MTL Annual Research Report, Nanotechnology, Nanostructures, Nanomaterials, 2018 (p. 26).
(Continued)

*Primary Examiner* — Jason Berman
(74) *Attorney, Agent, or Firm* — Potomac Law Group, PLLC; John J. Penny, Jr.

(57) ABSTRACT

A thin-film system comprising a microplasma region where sputtered particles are formed, a power supply that supplies power to the microplasma region, gas flow hardware to regulate flow of gas to the microplasma region, a deposition nozzle that forms a thin film on a substrate and a supply line for supplying sputtered particles to the deposition nozzle, wherein the microplasma region is decoupled from the deposition nozzle.

10 Claims, 3 Drawing Sheets

(56) References Cited

OTHER PUBLICATIONS

Kornbluth et al., "Microsputterer with integreated ion-drag focusing for additive manufacturing of thins, narrow conductive lines," J Phys D: Appl Phys 51, Apr. 4, 2018, 165603 (11 pp).

Kornbluth et al., "Room-temperature, atmospheric-pressure microsputtering of dense, electrically conductive, sub-100 nm gold films," Nanotechnology 30, Apr. 24, 2019, 285602 (10 pp).

Kornbluth et al., "Room-Temperature Printing of Micron-Scale-Wide Metal Lines for Microsystems via Atmospheric Microsputtering," IEEE 32nd International Conference on Micro Electro Mechanical Systems (MEMS), Jan. 27, 2019, pp. 372-375, doi: 1109/MEMSYS.2019.8870670.

Sun et al., "Exploration of Metal 3-D Printing Technologies for the Microfabrication of Freeform, Finely Featured, Mesoscaled Structures," J Microelectromech Sys, Dec. 2018, 27(6):1171-1185.

Zhang et al., "Employing a MEMS plasma switch for conditioning high-voltage kinetic energy harvesters," Nature Communications, 2020, 11:3221 (10 pp).

\* cited by examiner

SYSTEM FOR FOCUSED DEPOSITION OF ATOMIC VAPORS

FIELD OF THE INVENTION

This present invention relates generally to depositing a selected material on a substrate. More specifically, the invention relates to thin film deposition of conductors and insulators for creating devices such as interconnects, MEMs sensors, circuits and other electrical or optical devices. At least one embodiment of the invention relates to a micro-plasma based PVD/CVD system that enables high resolution deposition with reduced costs and time.

BACKGROUND OF THE INVENTION

Conventional thin film deposition requires expensive machines designed for a specific purpose of uniform deposition of a thin film on the surface of a silicon wafer. Although overhead of these conventional technique is high and the design restrictions are severe, the tools are reliable and their products are robust, which encourages the use of patterned thin films for the fabrication of microelectronics, MEMs and increasingly optical or microfluidic devices. However, these conventional uses of film deposition and patterning presents a barrier to entry for all but the largest companies. Accordingly, a new method that reduces costs while reliably producing thin film deposition at a higher throughput is needed.

Previous methods have deposited thin films using micro-plasma based sputtering by creating a plasma between the substrate and the cathode that sputters directly down to the substrate according to the dimension of the cathode. Also, previous techniques have flowed gas through a cylinder micro-sputter chamber, which acts a nozzle, in close proximity to the substrate to deposit films on the order of dimension of the orifice. Also, electrostatics have been used to manipulate the plasma between a nozzle and a substrate to focus the deposition and reduce the width of the printed lines. Other techniques have used aerosol jet printing or ink-jet printing to deposit traces of ink that contain high percentages of metal particles. However, these techniques have their drawbacks. For example, although ink-jet printheads are able to produce linewidths less than 5 μm, this can only be done in close proximity to the deposition surface (approximately 1 μm). Similarly, plasma focusing may be able to achieve linewidths of approximately 1 μm, but this requires the plasma to be in close proximity to the substrate surface. An aerosol jet head can achieve a linewidth of approximately 10 μm from a distance of approximately 5 mm.

Alternative material deposition methods with significantly lower costs and greater flexibility are available, but they have limited capabilities and fail to produce thin films of comparable quality. Maskless deposition solutions such as aerosol and inkjet printing relax design constraints by avoiding patterning costs, but these techniques are limited to viscous feedstock with short shelf lives, produce dimensions that are relatively large, and result in subpar properties. Sintered conductive inks are typically 2-10 times more resistive than bulk materials, which limits their applicability to routine digital applications. On the dielectric side, direct write polymer solutions are similarly inappropriate for demanding applications and generally cannot replace CVD nitride, PVD oxide, or other exotic functional materials realizable with thin film deposition technologies.

SUMMARY

At least one embodiment of the present invention is directed to a micro-plasma based PVD/CVD system that operates at or near atmospheric pressure for high resolution deposition of microelectronics and optical quality structures with reduced overhead costs and reduced lead time (maybe move to another section).

Micro-plasma deposition techniques represent a breakthrough technology that can potentially avoid patterning entirely, disrupt the direct write/printed electronics markets, and displace conventional deposition techniques. By confining a plasma to a small region and actively directing the flow the atomic vapors, deposition of high quality thin films can be achieved at atmospheric pressures without the instability, poor quality and curing requirements of printed ink. Several benchtop prototypes using sub-mm scale plasmas for directed PVD and CVD can deposit a variety of materials with sputtered conductive trace widths as narrow as 9 μm.

At least one embodiment of the invention comprises a micro-plasma region where a plasma is formed due to a high voltage between an anode and cathode, and where sputtering of target material occurs at relatively high pressures between 100 mTorr and 10 ATM, gas flow hardware including devices to regulate gas flow rate and pressure as gas flows into the micro-plasma region, where the flow directs sputtered particles towards a deposition nozzle, and a multi-axis motion gantry on which the nozzle or substrate are mounted to enable the deposition, or printing on planar or non-planar geometries. With this configuration, the micro-plasma region is decoupled from the deposition nozzle, which makes it possible to use multiple plasma sources with a single nozzle. That is, the generation of atomic vapor/plasma is separated from the substrate on which the atomic vapor/plasma deposition occurs.

Another embodiment can include multiple micro-plasma regions linked to a single nozzle through a series of valves to enable switching between multiple deposition materials from several micro-plasma sources.

Another embodiment can include multiple nozzles formed in an array to increase throughput of the system.

BRIEF DESCRIPTION OF THE DRAWINGS

The invention will be more fully understood by reference to the detailed description, in conjunction with the following figures, wherein.

DETAILED DESCRIPTION

Figure 1:
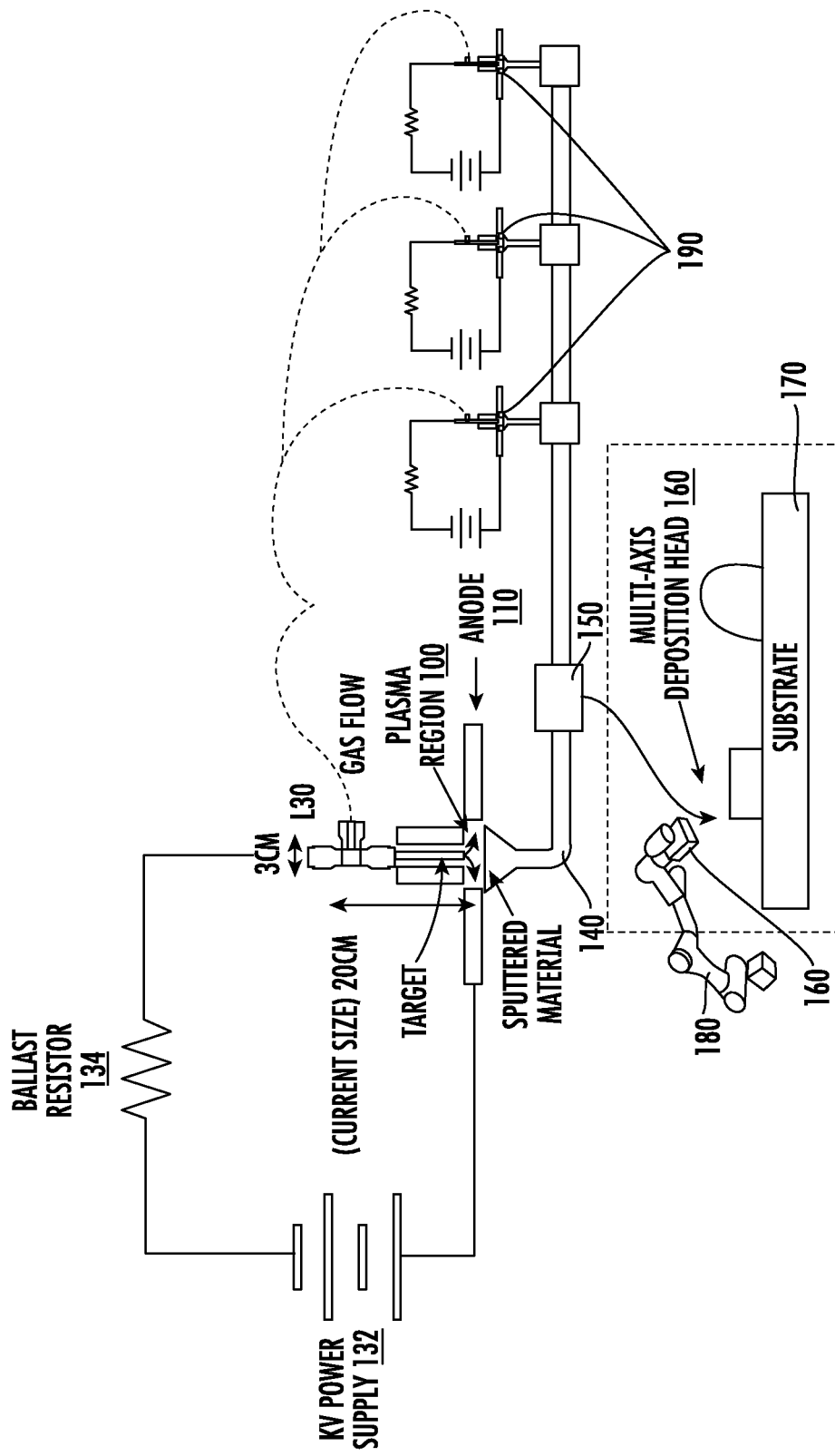
FIG. 1 shows one embodiment of the microplasma system.

The subject innovation is now described with reference to the drawings, wherein like reference numerals are used to refer to like elements throughout. In the following description, for purposes of explanation, numerals specific details are set forth in order to provide a thorough understanding of the present invention. It may be evident, however, that the present invention may be practiced without these specific details.

As shown in FIG. 1, at least one embodiment of the invention comprises a micro-plasma region 100 where a plasma is formed due to a high voltage between an anode 110 and cathode 120, and where sputtering of target material occurs at relatively high pressures between 100 mTorr and 10 ATM, gas flow hardware 130. The gas flow hardware 130, which regulates gas flow rate and pressure as gas flows into the micro-plasma region 100, can comprise mass flow controllers, pressure sensors, regulators and valves. A power supply 132 can be used to supply power to the gas flow hardware 130 through a ballast resistor 134. A suitable power supply is on the order of 0.6-2 kV. The power supply can be a DC or RF power supply. The gas flow hardware 130 directs the sputtered particles to a supply line 140. The supply line 140 is connected to a transfer junction supply line 150 that leads to a deposition nozzle 160, which deposits the sputtered particles onto a substrate 170. The nozzle 160 is mounted on a multi-axis motion gantry 180 to enable the deposition, or printing on planar or non-planar geometries. Alternatively, the substrate 170 can be mounted on the multi-axis motion gantry 180 such as a 3-axis XYZ gantry or a 5-axis XYZAB gantry. The deposition nozzle 160, the tip of which can be between approximately 10 μm and 25 μm from the substrate, constricts the flow of gas and sputtered particles and directs the particles to the surface where they form a thin film. A nozzle that focuses the flow into a jet to reduce the width of the deposited material also can be used. The orifice of the deposition nozzle can be between several nano-meters or several micro-meters. The flow-guided deposition system shown in FIG. 10 of U.S. Pat. No. 7,108,894 can be used.

Figure 2:
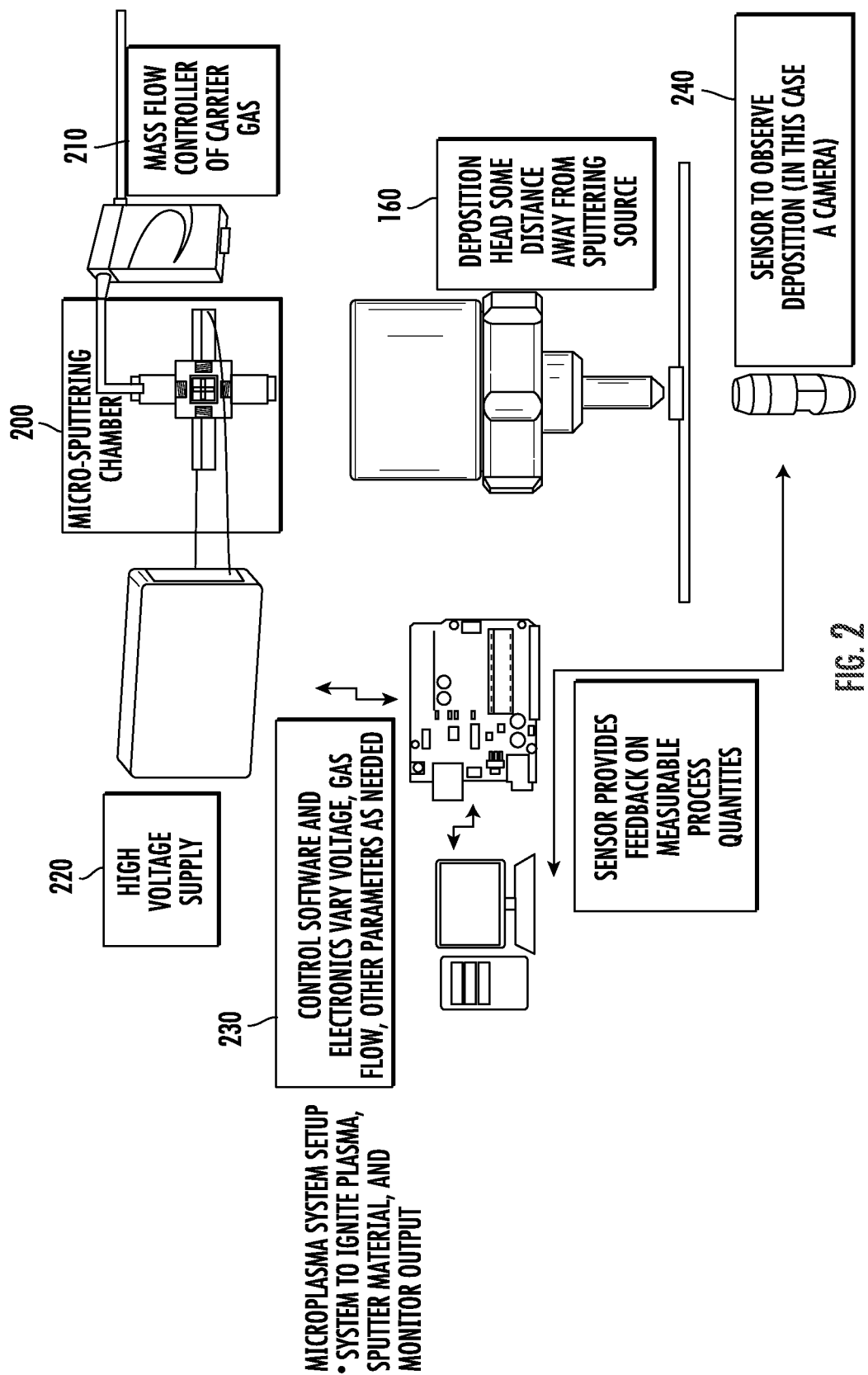
FIG. 2 shows additional details of the microplasma system of FIG. 1.

As shown in FIG. 2, the gas flow hardware 130 can include a micro-sputtering chamber 200, a mass flow controller of carrier gas 210, and a high voltage supply 220. Control software and electronics 230 controls the voltage, gas flow and other parameters as needed to the gas flow hardware 130 of FIG. 1. A sensor 240, such as a camera, can be used to observe the deposition and provide feedback on measurable quantities such as density of deposition, rate of deposition, thickness, linewidth, etc. Laser assisted deposition can be used to improve film quality. Also, the invention can be used for deposition on a wire as a roll-to-roll wire coating process.

With this configuration, the sputtering/micro-plasma region is decoupled from the deposition nozzle, which allows the use of multiple plasma sources and materials within a single machine with only one nozzle. Also, jet focusing and other techniques could be included in the single machine to achieve thinner lines without using a plasma. For example, one sputtering/micro-plasma station 190 could perform DC sputtering, another sputtering/micro-plasma station 190 could perform RF sputtering, another sputtering/micro-plasma station 190 could perform CVD, another sputtering/micro-plasma station 190 could perform PVD, etc. This makes it possible to perform different deposition techniques on a single substrate without moving the substrate from one machine to another, which takes time, is cumbersome, and can damage the wafer. Accordingly, at least one embodiment of the present invention allows for a rapid, seamless switchover from one process to another. Also, since this configuration is a maskless deposition process operating at or near atmospheric pressures, it avoids the costs and chemicals associated with photolithographic patterning and operating in high vacuum. Also, since the micro-plasma region is decoupled from the substrate, it is possible to conduct deposition at room temperature, achieve higher deposition rates and produce a higher film quality.

The system shown in FIG. 2, which can be small and inexpensive, allows for a rapid innovation cycle that can lead to process, system and material breakthroughs.

FIG. 1 shows four (4) sputtering/micro-plasma stations 190, but any number of sputtering/micro-plasma stations could be used. The use of multiple sputtering/micro-plasma stations allows for a very versatile manufacturing system that can utilize multiple deposition techniques and different materials in a single system. Also, maintenance can be performed at one station while another station is placed or replenished.

Figure 3:
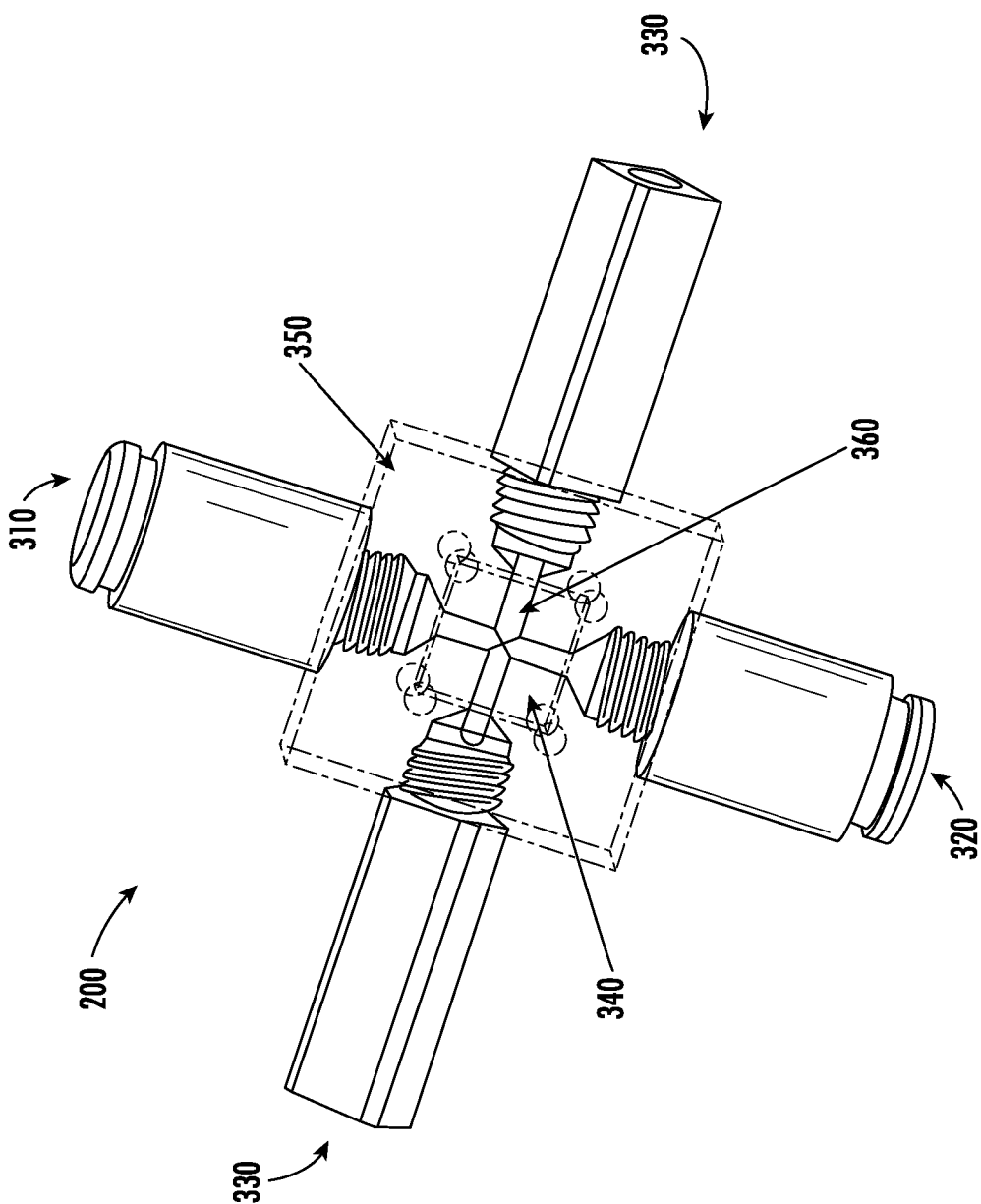
FIG. 3 shows the micro-sputtering chamber 200 of FIG. 2 in more detail.

FIG. 3 shows the micro-sputtering chamber 200 of FIG. 2 in more detail. Specifically, the micro-sputtering chamber 200 comprises a gas inlet passage 310, a gas outlet passage 320, and electrodes 330 positioned on opposite sides of the micro-sputtering chamber 200. A plasma chamber 340 is formed in a gap between the electrodes in which plasma can be formed. The spacing between the electrodes can be approximately 1-2 mm. The plasma chamber 340 can be a cylindrical hole formed within a glass cube between the target material 360. The glass cube also has holes for holding the target material 360 and holes that allow gas to flow to the plasma chamber 340. The glass cube holds the target material 360 to prevent the target material from being damaged by the plasma. The diameter of the cylindrical hole can be approximately the same as the diameter of the target material or slightly larger to allow for air to flow around the target material. The size of the glass cube can be approximately 5 mm×5 mm×5 mm, but could be larger. The glass cube is formed inside an outer part 350, which can be made of machined acrylic or other suitable plastic. The outer part 350 helps maintain the cleanliness of the inner glass tube and holds the electrodes 330, the gas inlet passage 310 and the gas outlet passage 320. The plasma chamber also could be formed from ceramic, or other material that can prevent contamination. The design for the micro-sputtering chamber 200 is small, inexpensive, parallelizable, and customizable The target material 360, such as a Gold wire having a diameter of 1 mm, is soldered into the electrode. A diameter smaller than 1 mm can be used. The edge of the target material can be blunt edges, or could be pointed or curved to give better performance. The target material is easily replaceable and trimmable to the proper length. A length of approximately 5 mm can be used. A wire feed device can be used to keep track of the amount of remaining target material and feed additional target material when needed. This reduces the amount of time required to replace the target material and minimizes down time.

The system shown in FIG. 2, which can be small and inexpensive, allows for a rapid innovation cycle that can lead to process, system and material breakthroughs.

Some embodiments of the invention can optimize film properties, deposition rates, and control linewidths while providing process and material flexibility.

It should be understood that the invention is not limited by the specific embodiments described herein, which are offered by way of example and not by way of limitation. Variations and modifications of the above-described embodiments and its various aspects will be apparent to one skilled in the art and fall within the scope of the invention, as set forth in the following claims. For example, various similar materials can be used in the cement board system without departing from the scope of the invention.

What is claimed is:

1. A thin-film system comprising:
   a microplasma region where sputtered particles are formed;

a power supply that supplies power to the microplasma region;

gas flow hardware to regulate flow of gas to the microplasma region;

a deposition nozzle that forms a thin film on a substrate; and a supply line for supplying the sputtered particles to the deposition nozzle through a transfer junction, wherein the microplasma region is decoupled from the deposition nozzle.

2. The system of claim 1, further including a multi-axis motion gantry on the deposition nozzle is mounted.

3. A thin-film system comprising:

a plurality of sputtering/micro-plasma stations where sputtered particles are formed;

a deposition nozzle that forms a thin film by depositing the sputtered particles on a substrate;

a supply line that supplies sputtered particles from the plurality of sputtering/micro-plasma stations to the deposition nozzle and a transfer junction that supplies a selected source of sputtered particles from the plurality of sputtering/micro-plasma stations to the deposition nozzle.

4. The system of claim 3, wherein the plurality of sputtering/micro-plasma stations are directed to different application methods, such as CVD, PVD and PECVD.

5. The system of claim 3, further including multiple nozzles formed in an array to increase throughput of the system.

6. A micro-sputtering chamber for use in a thin-film system, the micro-sputtering chamber comprising:

a gas inlet passage;

a gas outlet passage;

electrodes positioned on opposite sides of the micro-sputtering chamber;

a glass cube in which a plasma chamber is formed, the glass cube having holes formed therein that allow gas to flow to the plasma chamber and holes to hold a target material; and an outer part in which the glass cube is formed for holding the electrodes, the gas inlet passage and the gas outlet passage.

7. The micro-sputtering chamber of claim 6, wherein the glass cube has dimensions of approximately 5 mm×5 mm×5 mm.

8. The micro-sputtering chamber of claim 6, further including a wire feed device that keeps track of an amount of remaining target material and feed additional target material when needed.

9. The system of claim 1, further including multiple microplasma regions, each microplasma region being decoupled from the deposition nozzle.

10. The system of claim 3, further including electrodes positioned on opposite sides of the plurality of sputtering/micro-plasma stations.

* * * * *